United States Patent
Saki

[11] Patent Number: 5,960,297
[45] Date of Patent: Sep. 28, 1999

[54] SHALLOW TRENCH ISOLATION STRUCTURE AND METHOD OF FORMING THE SAME

[75] Inventor: Kazuo Saki, Yokohama, Japan

[73] Assignee: Kabushiki Kaisha Toshiba, Kawasaki, Japan

[21] Appl. No.: 08/887,137

[22] Filed: Jul. 2, 1997

[51] Int. Cl.[6] .............................................. H01L 21/762
[52] U.S. Cl. .......................................... 438/424; 438/296
[58] Field of Search .................................. 438/424, 425, 438/426, 435, 436, 437, 296

[56] References Cited

U.S. PATENT DOCUMENTS

| | | | |
|---|---|---|---|
| 4,465,532 | 8/1984 | Fukano | 156/643 |
| 4,580,330 | 4/1986 | Pollack et al. | 29/576 |
| 4,994,406 | 2/1991 | Vasquez | 437/67 |
| 5,298,450 | 3/1994 | Verret | 437/67 |
| 5,346,584 | 9/1994 | Nasr et al. | 156/636 |
| 5,356,828 | 10/1994 | Swan et al. | 437/67 |
| 5,358,894 | 10/1994 | Fazan et al. | 437/70 |
| 5,457,339 | 10/1995 | Komori et al. | 257/510 |
| 5,498,566 | 3/1996 | Lee | 437/67 |
| 5,521,422 | 5/1996 | Mandelman et al. | 257/510 |
| 5,578,518 | 11/1996 | Koike et al. | 437/67 |
| 5,712,185 | 1/1998 | Tsai et al. | 437/67 |
| 5,753,554 | 5/1998 | Park | 438/296 |
| 5,766,823 | 6/1998 | Fumitomo | 430/314 |
| 5,863,827 | 1/1999 | Joyner | 438/425 |

*Primary Examiner*—Olik Chaudhuri
*Assistant Examiner*—Daniel H. Mao
*Attorney, Agent, or Firm*—Banner & Witcoff, Ltd.

[57] ABSTRACT

An isolation structure is provided by a method which includes forming a pad oxide layer on a semiconductor substrate and then forming a pad nitride layer on the pad oxide layer. An opening is then formed which extends through the pad nitride layer, the pad oxide layer, and into the semiconductor substrate. The pad nitride layer is then isotropically etched, thereby pulling-back the pad nitride layer from the portion of the opening extending through the pad oxide layer. An insulating layer is formed to fill in the opening including the portion of the opening formed by the pulling-back of the pad nitride layer. The deposited insulating layer is then planarized using the pulled-back nitride layer as a stopper layer. The pulled-back pad nitride layer and the pad oxide layer are then removed.

12 Claims, 19 Drawing Sheets

| PULL BACK CONDITION | STI SHAPE |
|---|---|
| PULL BACK 100A |  |

| PULL BACK CONDITION | STI SHAPE |
|---|---|
| PULL BACK 300A |  |

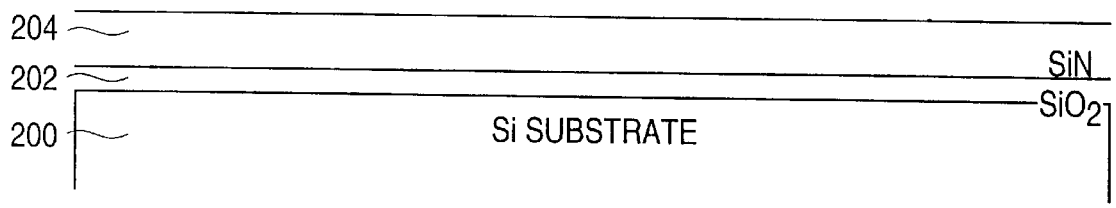
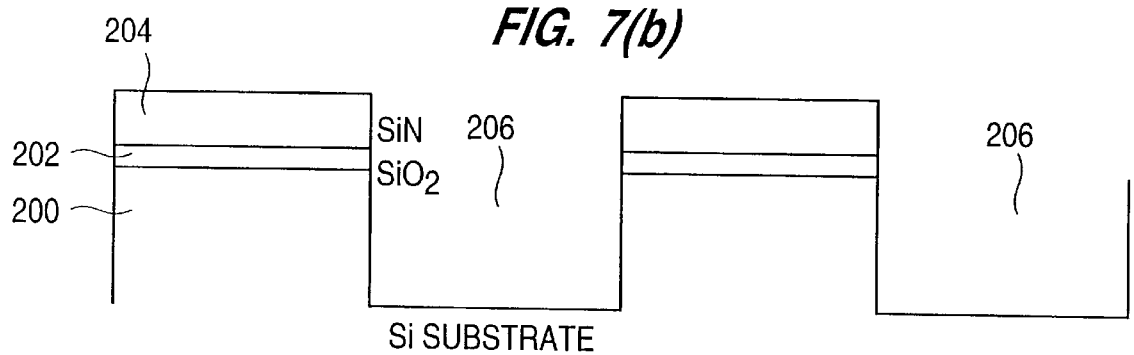
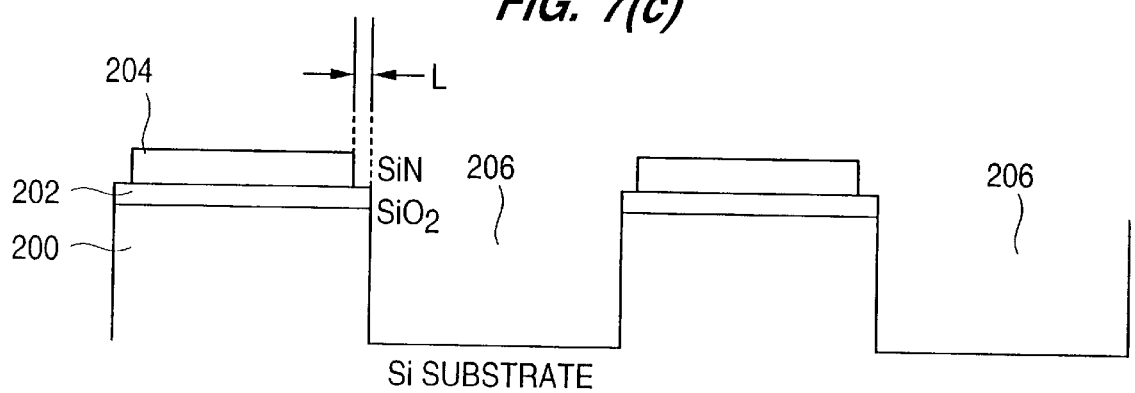

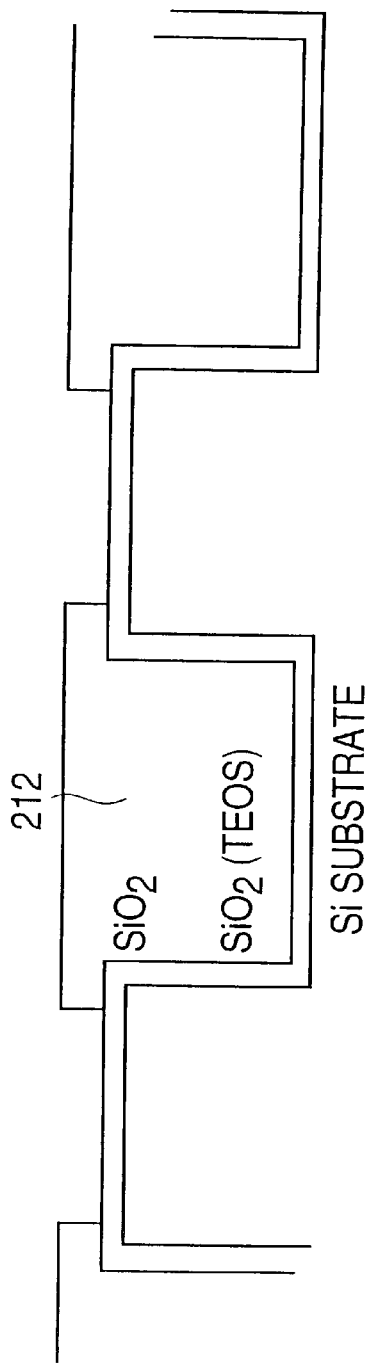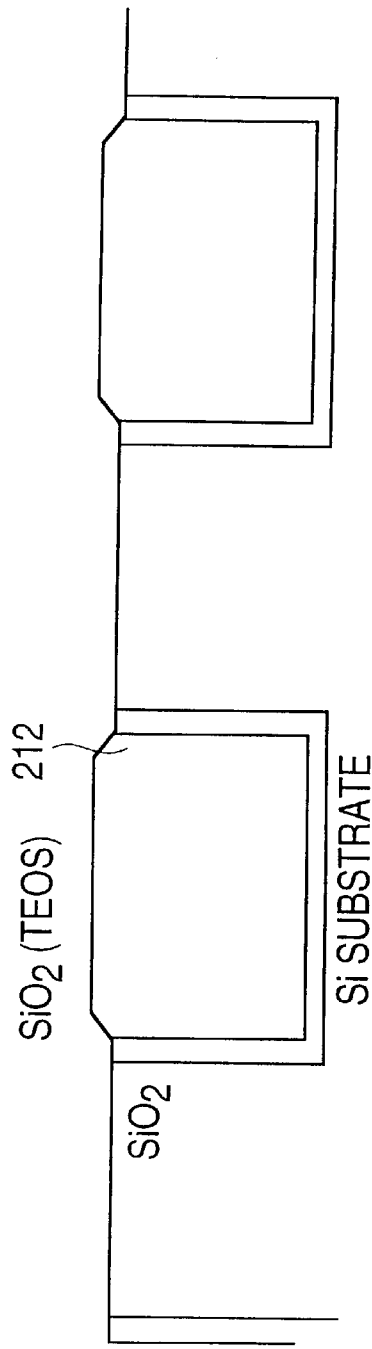

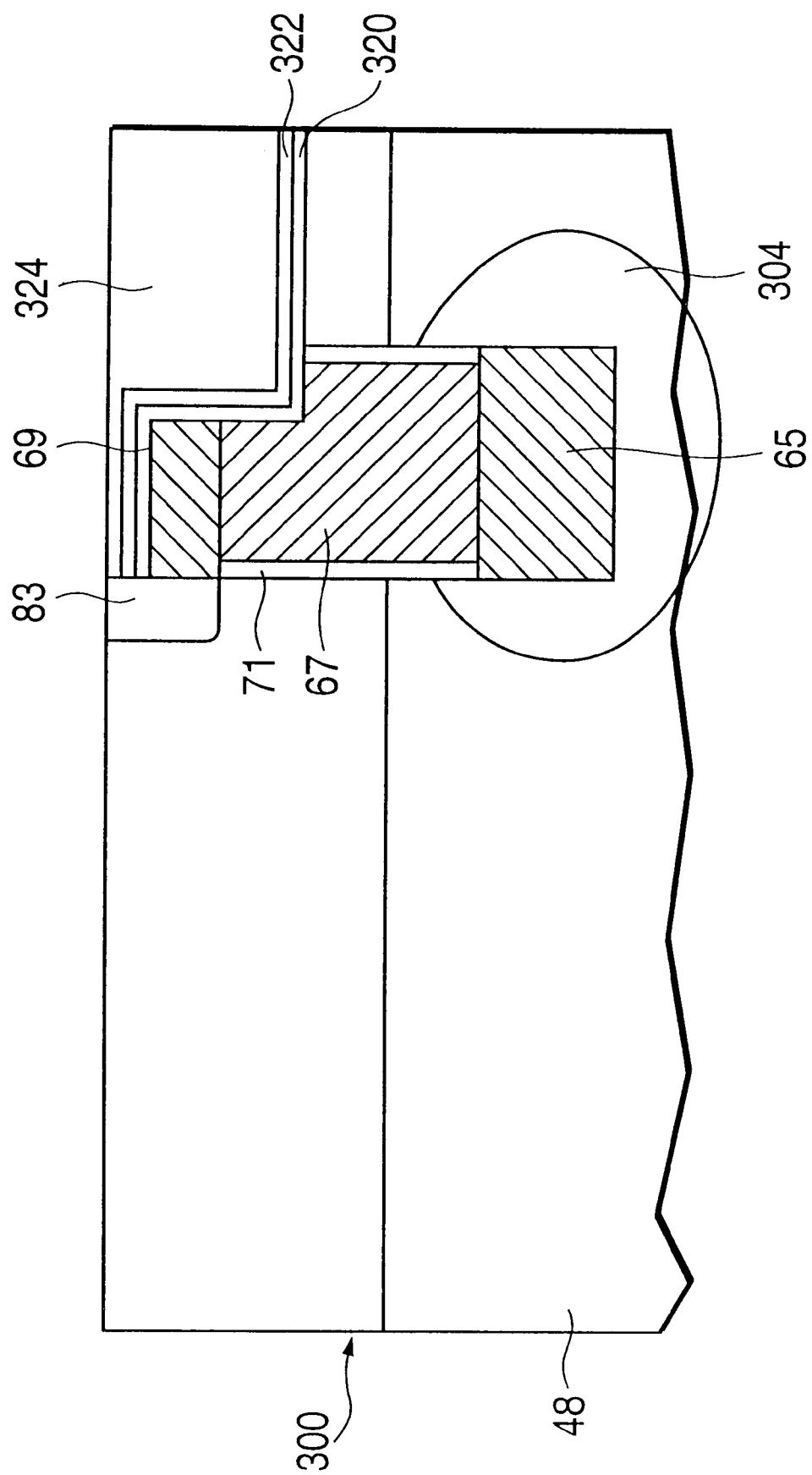

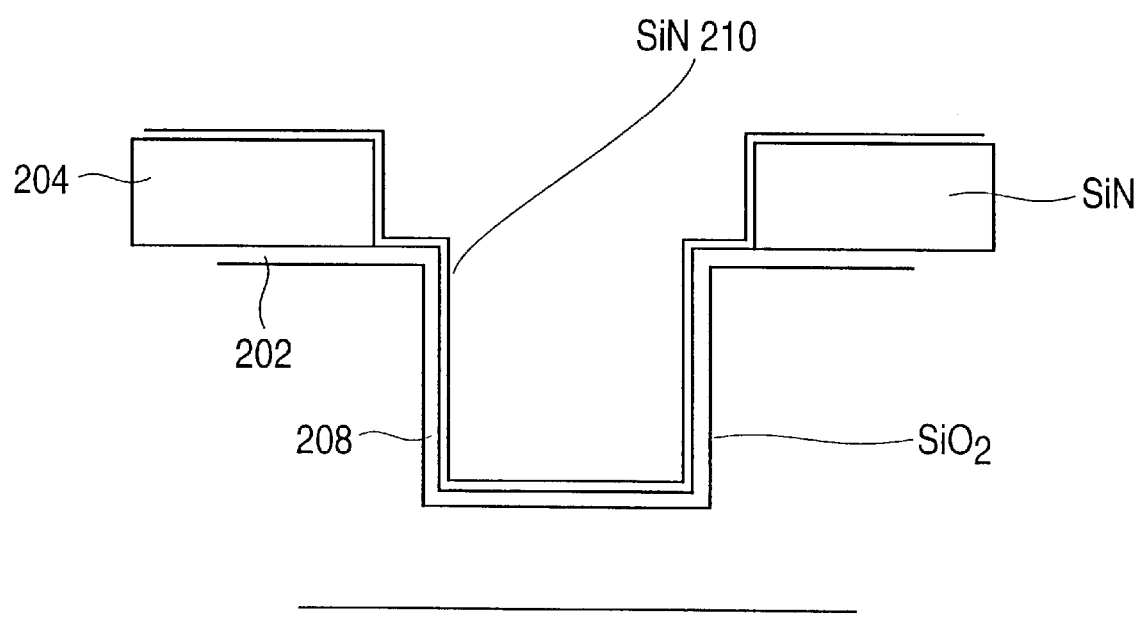

SHALLOW TRENCH ISOLATION STRUCTURE AND METHOD OF FORMING THE SAME

BACKGROUND OF THE INVENTION

1. Technical Field

The present invention generally relates to highly integrated semiconductor devices such as semiconductor memory devices and, more particularly, to an isolation structure for such devices and the methods for forming the isolation structure.

2. Description of the Related Art

An integrated circuit may be formed by connecting together various elements such as transistors which are formed on a semiconductor substrate. To ensure proper functioning of the integrated circuit, these elements must be electrically isolated from each other. Such isolation can be achieved using local oxidation of silicon (LOCOS) or shallow trench isolation (STI). Shallow trench isolation is particularly advantageous for circuits having a high integration density since shallow trench isolation can provide for a relatively planar surface on which subsequent insulating and/or conducting layers may be formed.

A conventional process for forming a shallow trench isolation (STI) structure is shown in FIGS. 1(a)–1(f). A silicon dioxide ($SiO_2$) layer 102 and a silicon nitride ($Si_3N_4$) layer 104 are successively formed on the surface of a silicon substrate 100 as shown in FIG. 1(a). A patterned resist (not shown) is formed on the upper surface of silicon nitride layer 104 and an etching process such as reactive ion etching (RIE) is used to form trenches 106 in silicon substrate 100 as shown in FIG. 1(b). A thermal oxidation process is then performed to form a thermal silicon dioxide ($SiO_2$) layer 108 on the exposed surfaces of the silicon substrate 100 as shown in FIG. 1(c). A silicon dioxide ($SiO_2$) layer 110 is then deposited by the decomposition of TEOS, for example, to fill in trenches 106 as shown in FIG. 1(d). The silicon dioxide layer 110 is then planarized by chemical mechanical polishing (CMP), for example, as shown in FIG. 1(e). Silicon nitride layer 104 serves as a stopper layer for the planarization process. Silicon nitride layer 104 is then removed. Various wet etching processes are used in subsequent manufacturing steps to remove the silicon dioxide layer 102, as well as to remove any sacrificial or dummy silicon dioxide layers which may be formed after removal of the silicon nitride layer. Such sacrificial silicon dioxide layers may be formed to clean the substrate surface prior to growing a gate oxide layer or to repair substrate damage due, for example, to implantation processes (e.g., channel implantation processes for controlling a threshold voltage of a transistor). However, these wet etching processes cause an etching away of the silicon dioxide at the corner 112 of the shallow trench isolation structure as shown in FIG. 1(f). This etching away of the silicon dioxide at the corner of the shallow trench isolation structure is shown in more detail in FIG. 2 and can result in a lowering of the threshold voltage of a transistor formed in the active area defined by the shallow trench isolation structure.

One technique of protecting the corner of a shallow trench isolation structure is described in U.S. Pat. No. 5,521,422 to Mandelman et al. In one embodiment of the Mandelman et al. process shown in FIGS. 3(a)–3(f), a pad oxide 10 and a nitride surface coating 12 are successively formed on the surface of a silicon substrate 5. The nitride surface coating 12 is then etched to form an opening 14 as shown in FIG. 3(a). Next, an insulator 16 such as a CVD oxide is deposited as shown in FIG. 3(b) and layer 16 and layer 10 are then etched as shown in FIG. 3(c) to leave spacers 16a and 16b on the sidewalls of the nitride surface coating. A trench 18, defined by the spacers 16a and 16b, is then formed in the silicon substrate 5 as shown in FIG. 3(d). An insulator 20 is deposited to fill trench 18 and opening 14. Insulator 20 is then planarized, stopping on nitride surface coating 12. Nitride surface coating 12 is then removed, leaving insulator 20 with spacers 16a and 16b extending above the surface of silicon substrate 5 as shown in FIG. 3(e). Subsequently, pad oxide 10 is etched and a gate dielectric 22 is formed. A gate conductor 24 is then deposited and photolithographically defined as shown in FIG. 3(f).

While the Mandelman et al. process protects the corner of the shallow trench isolation structure from attack during subsequent etching processes, several problems can arise. In particular, the protection of the corner of the shallow trench isolation structure depends on the length "L" shown in FIG. 4. The length "L" refers to the distance that the sidewalls 16a and 16b extend from the corners of the shallow trench isolation structure. Variations in this length "L" can lead to variations in the shape of the shallow trench isolation structures, particularly if the length "L" is varied to be too small such that subsequent etching processes result in the removal of the sidewalls and the attack of the corner of the shallow trench isolation structure. This can result in fluctuations in the device characteristics. Accordingly, the length "L" must be accurately controlled to ensure protection of the corners of the shallow trench isolation structure. In the Mandelman et al. process, the length "L" is determined by the thickness of the insulator 16 deposited during the deposition step shown in FIG. 3(b) and the amount of the insulator 16 which is etched during the reactive ion etching step of FIG. 3(c). Since the length "L" depends on the uniformity of both of these processes and since the uniformity of both of these processes can be affected by, inter alia, wafer position (e.g., center of wafer versus peripheral portion of wafer), the length "L" can be difficult to control in the Mandelman et al. process, leading to possible fluctuations in device characteristics.

In addition, as can be seen in FIG. 3(f), insulator 20 and sidewall spacers 16a and 16b extend above the surface of silicon substrate 5. A step is formed inevitably on the gate electrode 24 since there is a difference in level created between the surface of silicon substrate 5 and the insulator 20. This can lead to difficulties in the patterning of the gate conductor 24, particularly in highly integrated devices such as 64 Mbit and 256 Mbit dynamic random access memories (DRAMs).

Further, the process of Mandelman et al. requires a number of additional steps as compared to the conventional process of FIGS. 1(a)–1(f), e.g., the deposition of insulator 16 and the etching of insulator 16.

Accordingly, it would be desirable to provide a shallow trench isolation structure and methods for forming the shallow trench isolation structure which avoid these and other problems.

SUMMARY OF THE INVENTION

In accordance with one aspect of the present invention, an isolation structure is provided by a method which includes forming a pad oxide layer on a semiconductor substrate and then forming a pad nitride layer on the pad oxide layer. An opening is then formed which extends through the pad nitride layer, the pad oxide layer, and into the semiconductor substrate. The pad nitride layer is then isotropically etched, thereby pulling-back the pad nitride layer from the portion of the opening extending through the pad oxide layer. An insulating layer is formed to fill in the opening including the portion of the opening formed by the pulling-back of the pad nitride layer. The deposited insulating layer is then planarized using the pulled-back nitride layer as a stopper layer. The pulled-back pad nitride layer and the pad oxide layer are then removed.

In accordance with the above-described method, the insulator at the corner of the shallow trench isolation structure is protected from attack during subsequent etching processes and problems due to changes in the threshold voltages of elements formed in the active area defined by the shallow trench isolation structure can be reduced. In addition, since the pulling-back of the pad nitride is carried out in an isotropic etching step, the method of the present invention provides for enhanced controllability of the shape of the shallow trench isolation structure. Still further, the method of the present invention has a small number of steps and therefore contributes to ease of device manufacture and reduced manufacturing costs.

These and other features and advantages of the present invention will be better understood from a reading of the following detailed description in conjunction with the accompanying drawings.

BRIEF DESCRIPTION OF THE DRAWINGS

FIGS. 7(a)–7(h) are cross-sectional views illustrating a method for forming a shallow trench isolation structure in accordance with a second embodiment of the present invention.

FIGS. 9(a)–9(g) are cross-sectional views illustrating a method for forming a DRAM memory cell which includes the method for forming a shallow trench isolation structure in accordance with the present invention.

FIG. 10 illustrates a modification of the first embodiment of the present invention.

DETAILED DESCRIPTION

Figure 5A:
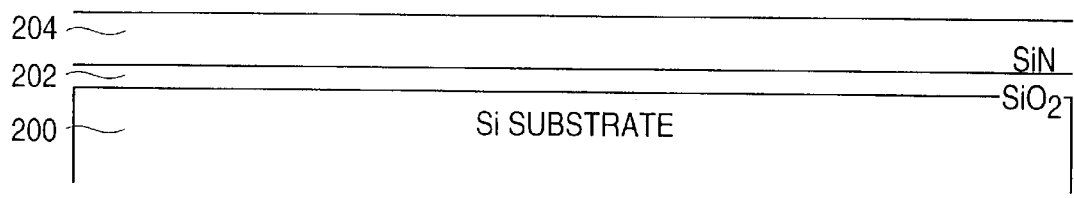
FIGS. 5(a)–5(i) are cross-sectional views illustrating a method for forming a shallow trench isolation structure in accordance with a first embodiment of the present invention.
Figure 5B:
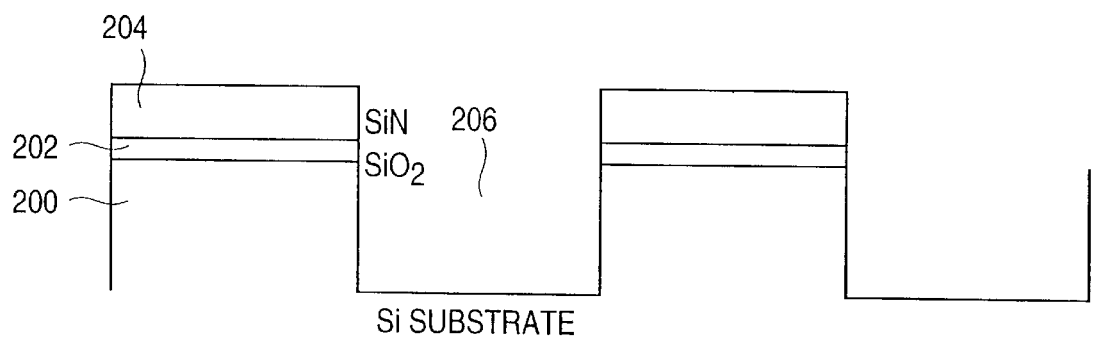
Figure 5C:
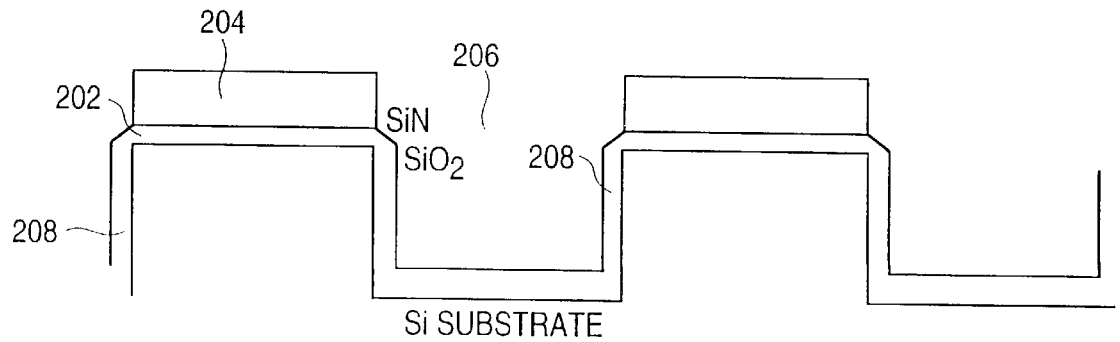
Figure 5D:
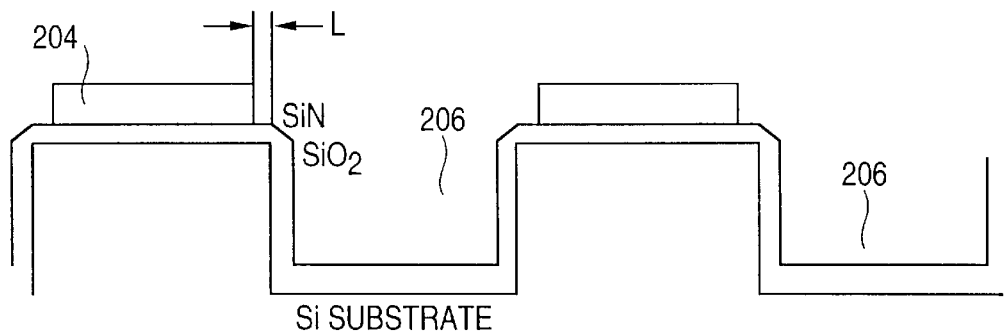

FIGS. 5(a)–5(i) are cross-sectional views illustrating a method for forming a shallow trench isolation structure in accordance with a first embodiment of the present invention. As shown in FIG. 5(a), a pad silicon dioxide ($SiO_2$) layer 202 and a pad silicon nitride ($Si_3N_4$) layer 204 are provided on a substrate 200. Silicon dioxide layer 202 has a thickness of about 80 Å–100 Å (e.g., 82 Å) and may be formed by thermal oxidation or by low pressure chemical vapor deposition (LPCVD), for example. Silicon nitride layer 204 has a thickness of about 1000 Å–2000 Å (e.g., 1300 Å) and may be formed, for example, by LPCVD. Substrate 200 may be a silicon wafer or an epitaxial layer formed on a silicon wafer. A patterned photoresist (not shown) is then formed on pad silicon nitride layer 204. The pad silicon nitride layer, the pad silicon dioxide layer, and the substrate are then etched, for example, by reactive ion etching using the patterned photoresist as a mask to form a trench 206 as shown in FIG. 5(b). A thin silicon dioxide ($SiO_2$) layer 208 having a thickness of about 80 Å–100 Å is formed by a high temperature (for example, 1000° C.) thermal oxidation over the portions of the silicon substrate exposed by the forming of trench 206 as shown in FIG. 5(c). This high temperature oxidation removes substrate damage caused by the etching process for forming trench 206. Pad silicon nitride layer 204 is then isotropically etched by, for example, chemical dry etching. In accordance with the present invention, the amount of silicon nitride which is etched during this isotropic etching step is about 250 Å. Thus, the isotropic etch pulls back pad silicon nitride layer 204 by a distance L=250 Å relative to the sidewall of trench 206 as shown in FIG. 5(d). It will be apparent to one skilled in the art that the amount of silicon nitride to be isotropically etched in this etching step will depend on the overall manufacturing process into which the teachings of this invention are incorporated. In general, the amount of silicon nitride to be etched should be sufficient to result in the protection of the corners of the shallow trench isolation structure from attack. In addition, the isotropic etching of the pad silicon nitride layer should leave silicon nitride having a thickness which is sufficient to function as a stopper layer for the planarization process to be described below with reference to FIG. 5(f).

Optionally, a thin silicon nitride layer 210 having a thickness of about 50 Å may then be deposited by, for example, CVD on pad silicon nitride layer 204 and on silicon dioxide layer 208 as shown in FIG. 10. Silicon nitride layer 210 may be provided, for example, in order to prevent oxidation of underlying layers during subsequent processing steps. In this case, the amount of silicon nitride which is etched during the isotropic etching step is about 300 Å. In this way, the composite silicon nitride layer comprising pad silicon nitride layer 204 and silicon nitride layer 210 is pulled-back by about 250 Å from the sidewall of trench 206.

Figure 5E:
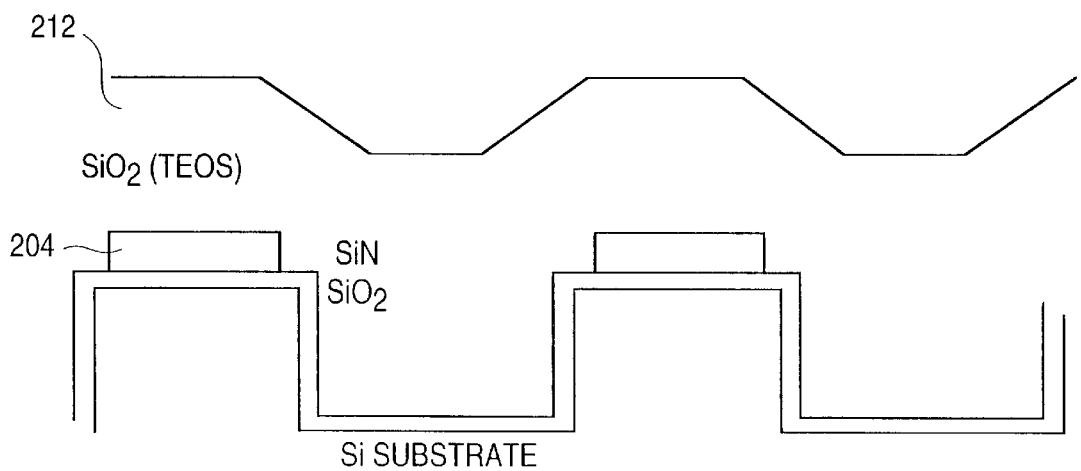
Figure 5F:
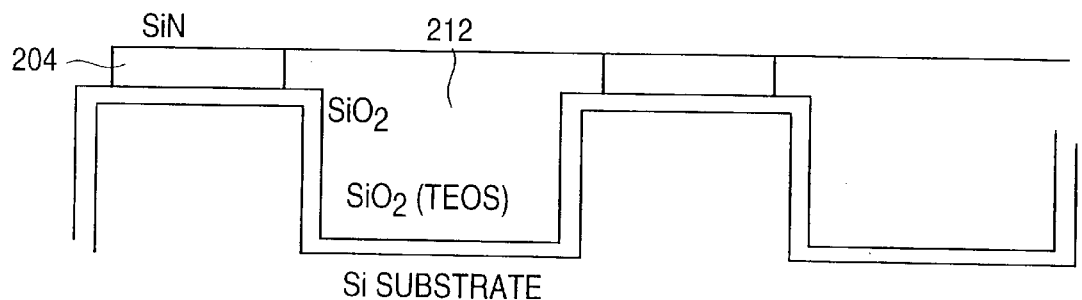
Figure 5G:
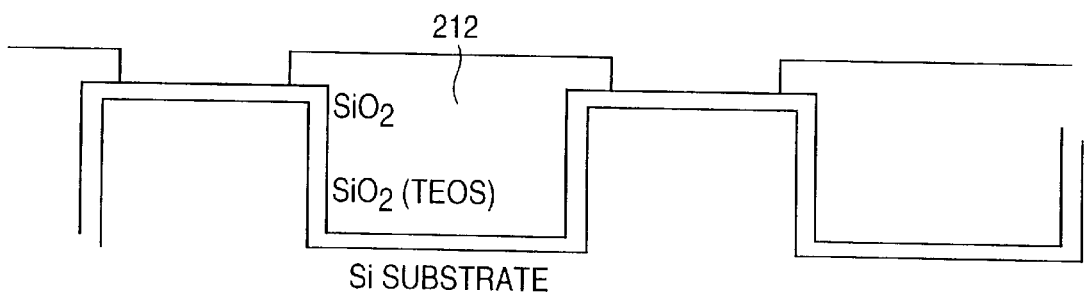
Figure 5H:
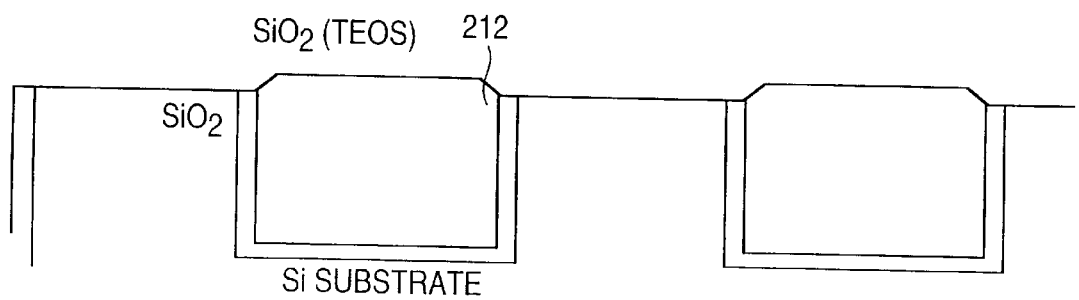

A silicon dioxide layer 212 is then blanket deposited over the entire surface of the substrate using, for example, a CVD process in which TEOS ($Si(OC_2H_5)_4$) is decomposed, as shown in FIG. 5(e). Other deposition techniques for depositing the silicon dioxide layer 212, such as a plasma CVD process using $O_3$ and TEOS, may be utilized. The silicon dioxide layer 212 is then planarized using, for example, RIE, chemical mechanical polishing, or a combination thereof as shown in FIG. 5(f). The pad silicon nitride layer 204 is then removed by, for example, chemical dry etching (CDE), hot phosphoric acid or HF/Glycerol as shown in FIG. 5(g). One or more wet etching processes are then utilized to remove the pad silicon dioxide layer 202, as well as to remove any sacrificial or dummy oxides which may be formed, resulting in the structure shown in FIG. 5(h). Because pad silicon nitride layer 204 was pulled-back by an isotropic etching process, the shallow trench isolation structure of FIG. 5(g)

has a T-shape. In this way, subsequent wet etching processes for removing the pad silicon dioxide layer 202 and any sacrificial or dummy oxide layers attack these extensions of the shallow trench isolation structure and do not result in an etching away of the insulator at the corner of the shallow trench isolation structure as can be seen with reference to FIG. 5(h).

Figure 1A:
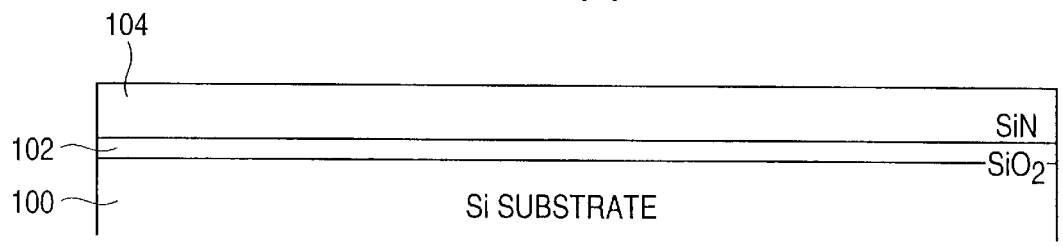
FIGS. 1(a)–1(f) are cross-sectional views illustrating a conventional method for forming a shallow trench isolation structure.
Figure 1B:
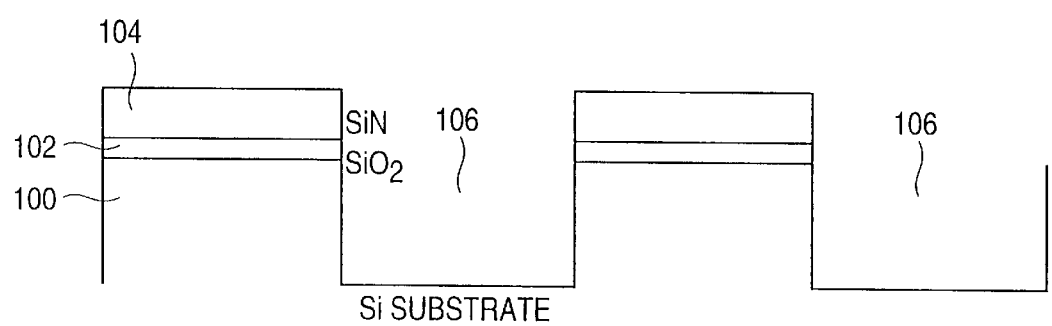
Figure 1C:
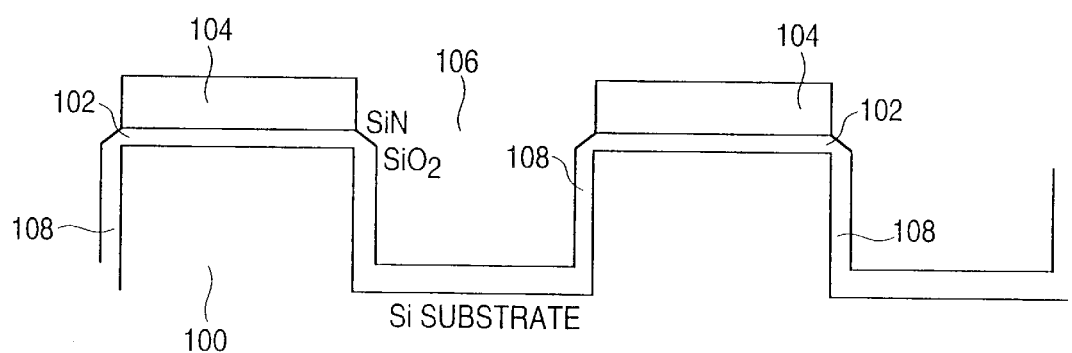
Figure 1D:
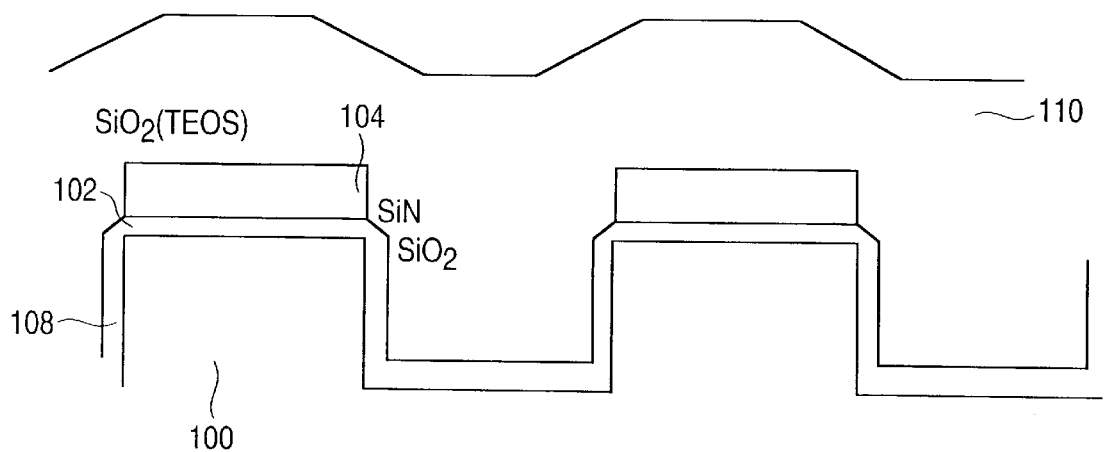
Figure 1E:
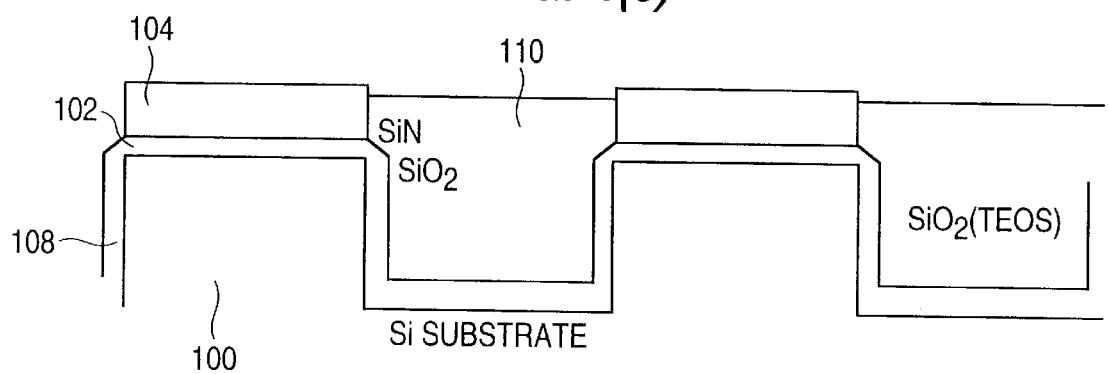
Figure 1F:
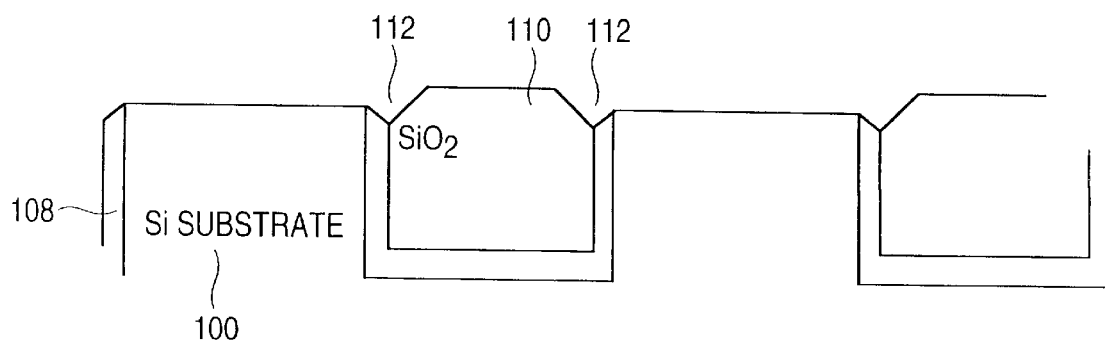
Figure 2:
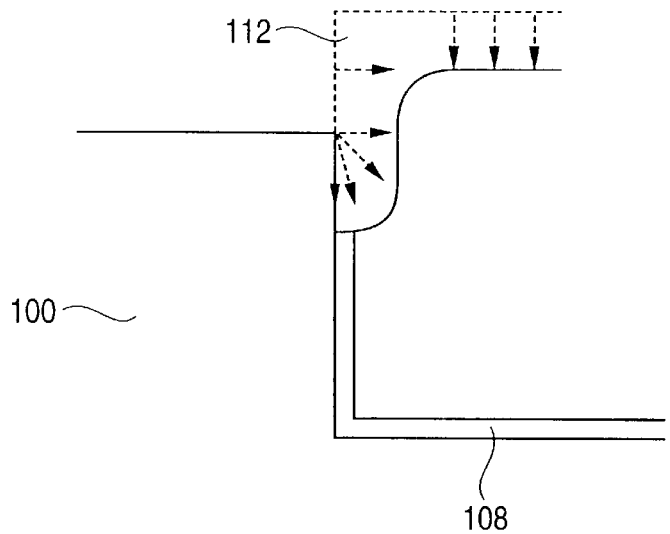
FIG. 2 illustrates the etching away of the silicon dioxide at the corner of a shallow trench isolation structure by etching processes after the formation of the shallow trench isolation structure.
Figure 3A:
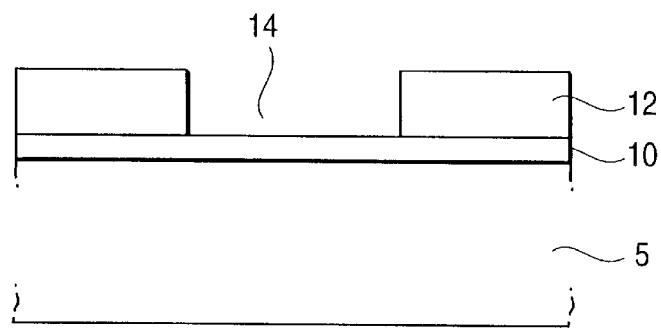
FIGS. 3(a)–3(f) illustrate a prior art method which avoids the etching away of silicon dioxide shown in FIG. 2.
Figure 3B:
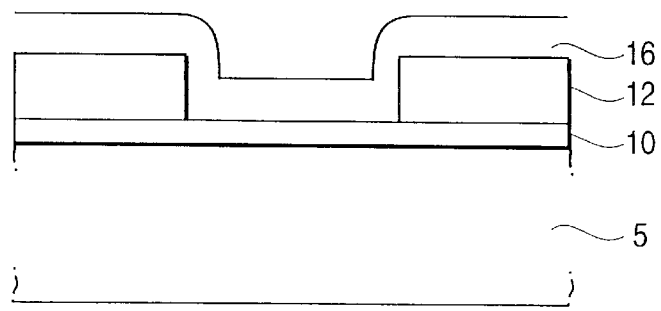
Figure 3C:
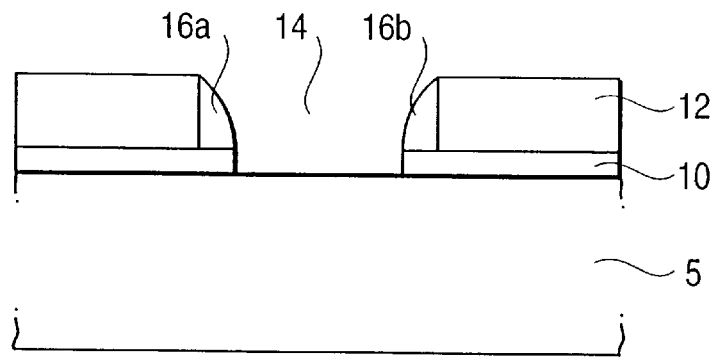
Figure 3D:
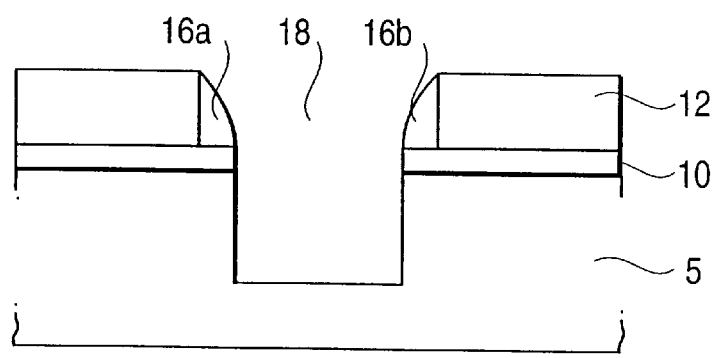
Figure 3E:
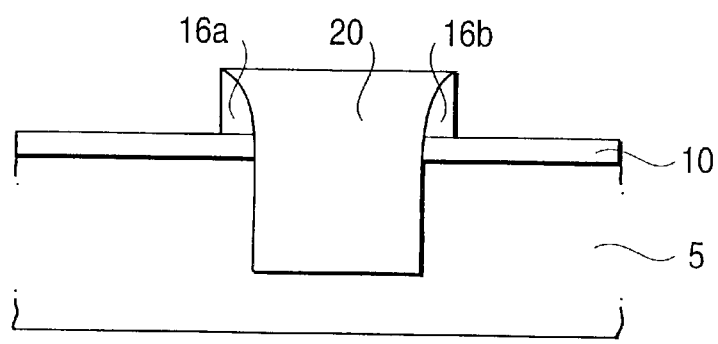
Figure 3F:
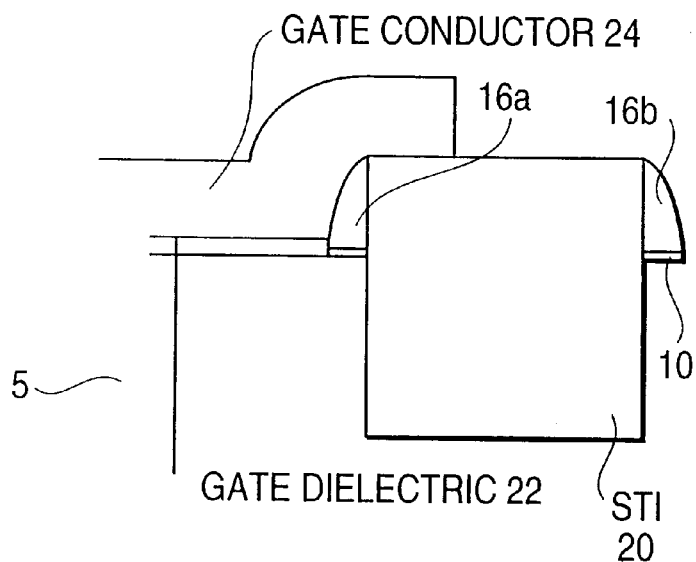
Figure 4:
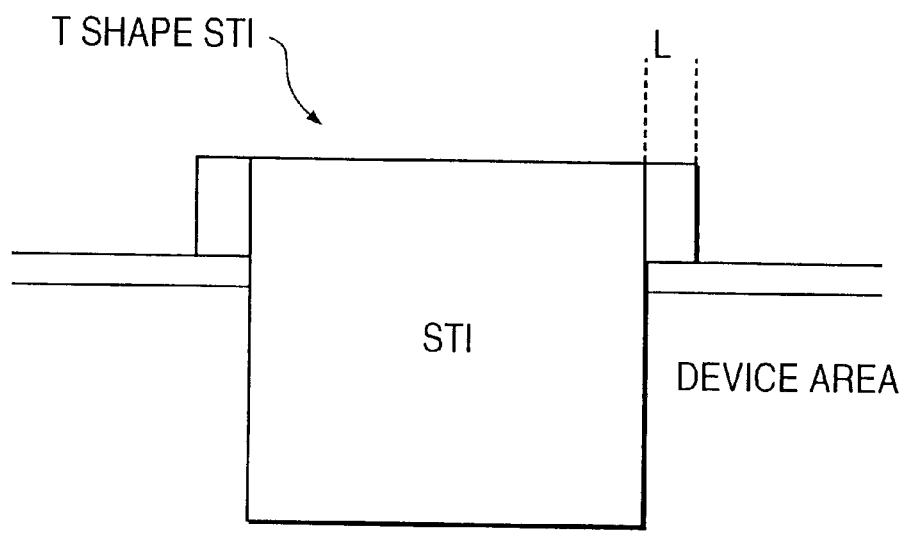
FIG. 4 is used in the explanation of a problem which is associated with the method of FIGS. 3(a)–3(f).
Figure 5I:
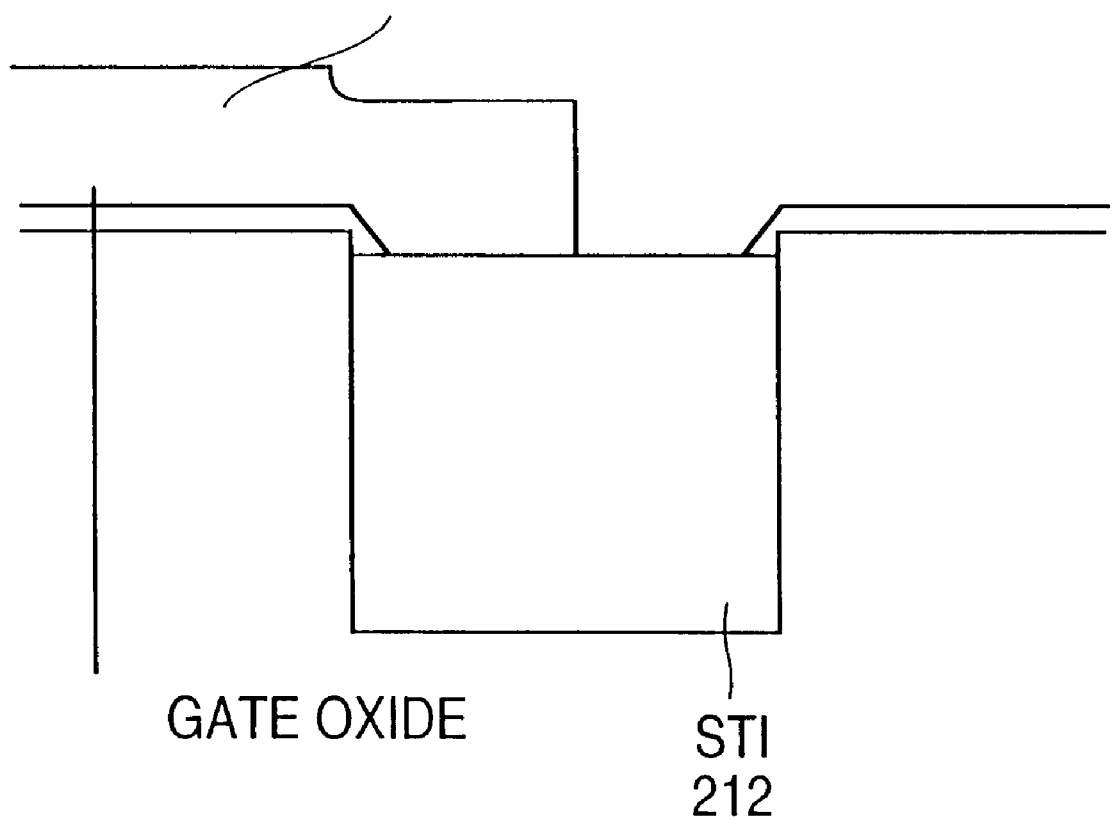

Thus, in accordance with the above-described method of the present invention, etching of the insulator at the corner of the shallow trench isolation structure is suppressed and problems due to changes in the threshold voltages of elements formed in the active area defined by the shallow trench isolation structure can be minimized. As discussed with respect to FIG. 4, the degree to which the corner of the structure is protected is determined by the length "L". In accordance with the present invention, this length "L" is determined by the isotropic etching of the pad silicon nitride layer. Since, in accordance with the present invention, only a single process factor affects the length "L", enhanced controllability of the shape of the shallow trench isolation structure can be achieved and therefore fluctuations in device characteristics can be reduced. In addition, because an upper surface of the shallow trench isolation structure and the surface of the substrate are substantially level, no step is created between the shallow trench isolation structure and a subsequently formed gate conductor 214 as shown in FIG. 5(i). Thus, patterning of the gate electrode is simplified. Still further, the method of the present invention has a small number of steps and therefore contributes to ease of device manufacture and reduced manufacturing costs.

Figure 6A:
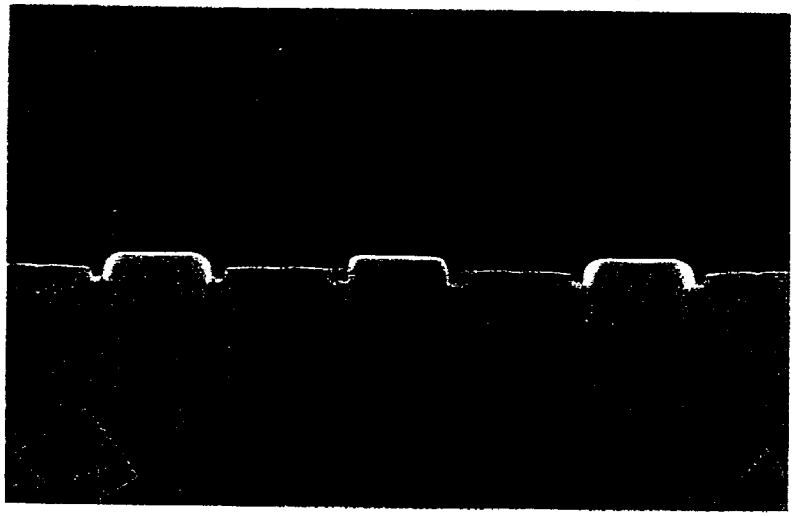
FIGS. 6(a) and 6(b) illustrate shallow trench isolation structures obtained with a silicon nitride pull-back of 100 Å and 300 Å, respectively.
Figure 6B:
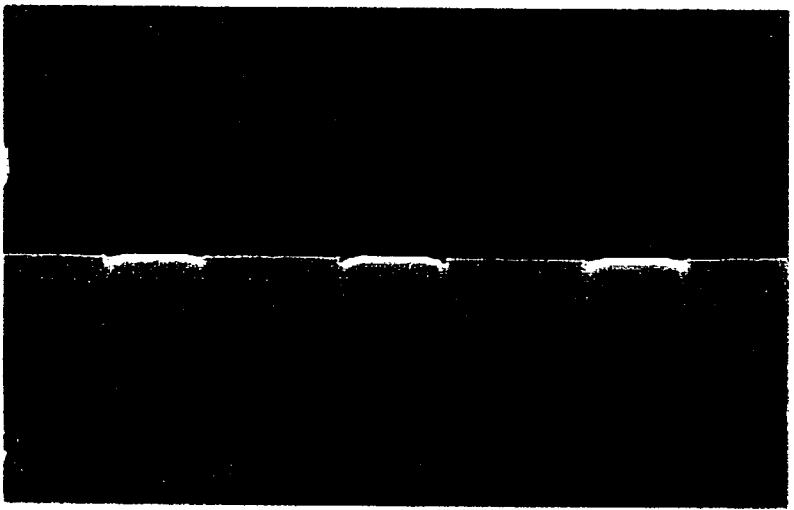

FIGS. 6(a) and 6(b) illustrate the shapes of shallow trench isolation structures manufactured in accordance with the above-identified method (including the step of forming the silicon nitride layer 210 shown in FIG. 10) in which the amount of the pad silicon nitride layer which is etched during the isotropic etching step is 100 Å and 300 Å, respectively. As can be seen from these Figures, the etching of the insulator at the corners of the shallow trench isolation structures by wet etching processes after formation of the shallow trench isolation structure is greater in the case of the 100 Å isotropic etch than in the case of the 300 Å isotropic etch. Thus, a pull-back of the pad silicon nitride layer by 300 Å provides greater protection for the corners of the shallow trench isolation than a pull-back of the pad silicon nitride layer by 100 Å. The larger the pulling-back of the pad silicon nitride layer, the longer the horizontal extensions of the "T-shape" of the structure of FIG. 5(g), and the greater the protection of the corners of the shallow trench isolation structure. However, since the etching of the pad silicon nitride layer is an isotropic etch, the larger the pulling-back, the thinner the remaining pad silicon nitride layer will be. As noted above, the remaining pad silicon nitride layer should have a thickness sufficient for serving as a stopper layer for the planarization process of FIG. 5(f).

Figure 7D:
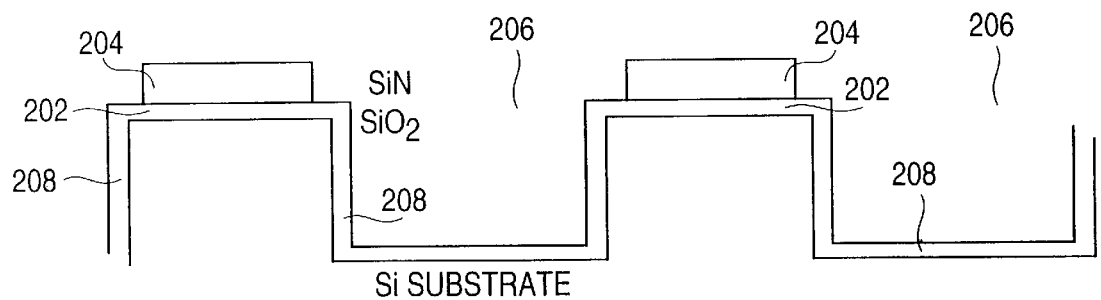
Figure 7E:
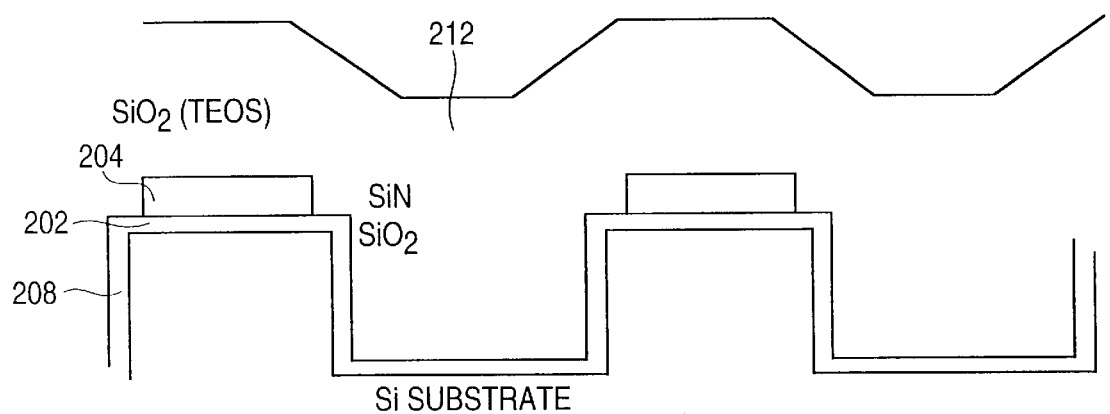
Figure 7F:
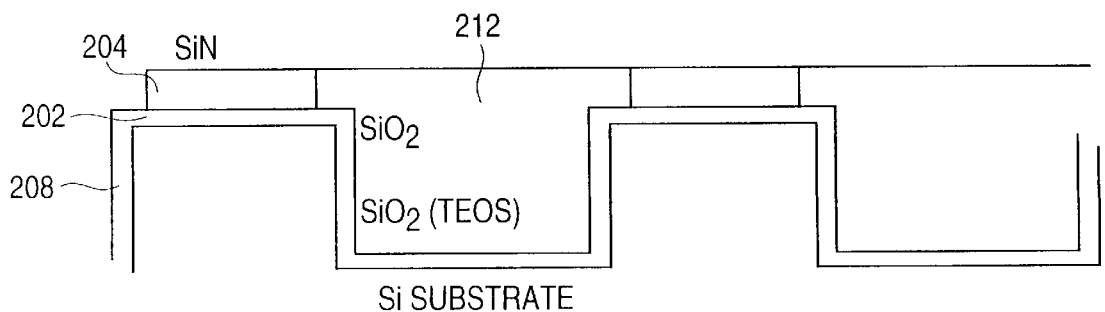

FIGS. 7(a)–7(h) are cross-sectional views illustrating a method for forming a shallow trench isolation structure in accordance with a second embodiment of the present invention. As shown in FIG. 7(a), a pad silicon dioxide ($SiO_2$) layer 202 and a pad silicon nitride ($Si_3N_4$) layer 204 are provided on a substrate 200. Silicon dioxide layer 202 has a thickness of about 80 Å–100 Å (e.g., 82 Å) and may be formed by thermal oxidation or by low pressure chemical vapor deposition (LPCVD), for example. Silicon nitride layer 204 has a thickness of about 1000 Å–2000 Å (e.g., 1300 Å) and may be formed, for example, by LPCVD. Substrate 200 may be a silicon wafer or an epitaxial layer formed on a silicon wafer. A patterned photoresist (not shown) is then formed on pad silicon nitride layer 204. The pad silicon nitride layer, the pad silicon dioxide layer, and the substrate are then etched by, for example, reactive ion etching using the patterned photoresist as a mask to form a trench 206 as shown in FIG. 7(b). Pad silicon nitride layer 204 is then isotropically etched using, for example, HF/Glycerol or hot phosphoric acid. In accordance with the present embodiment, the amount of silicon nitride which is etched during this isotropic etching step is about 250 Å. Thus, the isotropic etch pulls back the pad silicon nitride layer by a distance L=250 Å relative to the sidewall of trench 206, as shown in FIG. 7(c). A thin silicon dioxide ($SiO_2$) layer 208 having a thickness of about 80Å–100Å is formed by a high temperature (for example, 1000° C.) thermal oxidation over the portions of the silicon substrate exposed by the forming of trench 206 as shown in FIG. 7(d). This high temperature oxidation removes substrate damage caused by the etching process for forming trench 206. Optionally, a thin silicon nitride layer (not shown) having a thickness of about 50 Å may then be deposited by, for example, CVD on pad silicon nitride layer 204 and on silicon dioxide layer 208. The silicon nitride layer may be provided, for example, in order to prevent oxidation of underlying layers during subsequent processing steps. As in the first embodiment, if the 50 Å silicon nitride layer is formed, the amount of silicon nitride which is etched during the isotropic etching step is about 300 Å. In this way, a composite silicon nitride layer is formed which is pulled back by about 250 Å from the sidewall of trench 206. Next, a silicon dioxide layer 212 is blanket deposited over the entire surface of the substrate using, for example, a CVD process in which TEOS ($Si(OC_2H_5)_4$) is decomposed, as shown in FIG. 7(e). The silicon dioxide layer 212 is then planarized using, for example, RIE, chemical mechanical polishing, or a combination thereof as shown in FIG. 7(f). The pad silicon nitride layer 204 is then removed by, for example, chemical dry etching (CDE) or etching using hot phosphoric acid or HF/glycerol as shown in FIG. 7(g). One or more wet etching processes are then utilized to remove the pad silicon dioxide layer 202, as well as any sacrificial or dummy oxide layers which may be formed, resulting in the structure shown in FIG. 7(h). Because the pad silicon nitride layer was pulled-back by an isotropic etching process, the shallow trench isolation structure of FIG. 7(g) has a T-shape. In this way, subsequent wet etching processes for removing the pad silicon dioxide layer 202 and any sacrificial or dummy oxide layers attack these extensions of the shallow trench isolation structure and do not result in an etching away of the insulator at the corner of the shallow trench isolation structure as can be seen with reference to FIG. 7(h).

The same advantages which are obtained in the first embodiment are also obtained in the second embodiment.

Figure 8A:
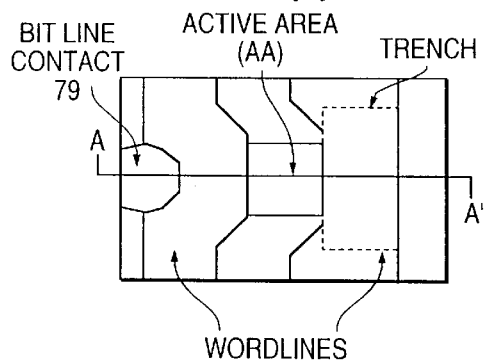
FIG. 8(a) is a top-down view of a trench DRAM cell with a self-aligned buried strap which is isolated from other cells by a shallow trench isolation structure formed in accordance with the present invention.
Figure 8B:
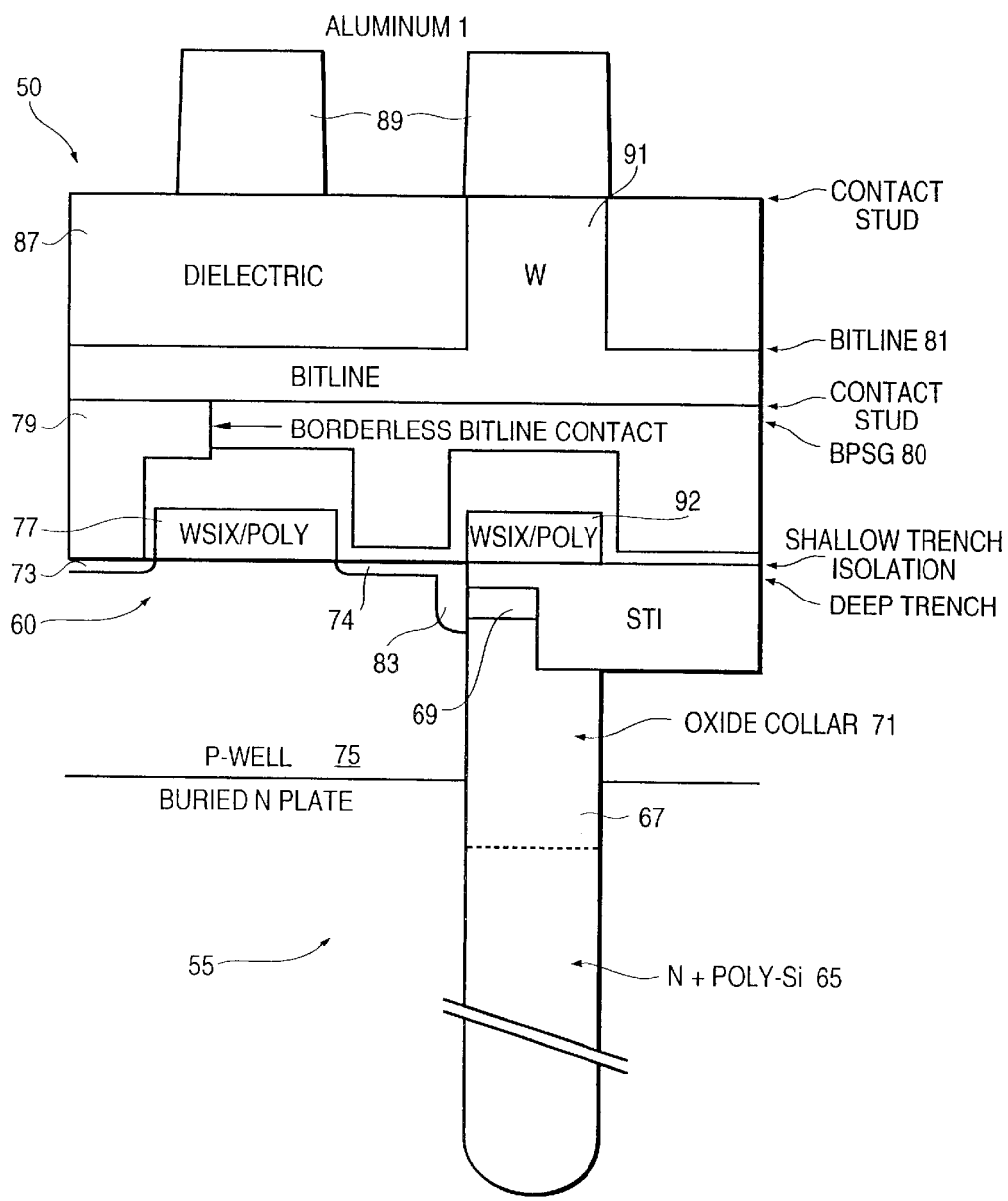
FIG. 8(b) is a cross-sectional view taken along line A–A' of FIG. 8(a).

FIGS. 8(a) and 8(b) illustrate a trench DRAM cell with a self-aligned buried strap which is isolated from other cells by a shallow trench isolation structure in accordance with the present invention. Specifically, FIG. 8(a) is a top-down view of the trench DRAM cell and FIG. 8(b) is a cross-sectional view taken along line A–A' of FIG. 8(a). DRAM cell 50 includes a trench capacitor 55 and a transfer gate 60. Trench capacitor 55 includes a first $N^+$-type polycrystalline silicon fill 65, a second polycrystaline silicon fill 67, and a collar oxide 71. Transfer gate 60 includes N-type source/drain and drain/source regions 73 and 74 formed in P-type well 75 and a $WSi_x$/polycrystaline silicon gate 77 insulatively spaced from the channel region between source/drain region 73 and drain/source region 74. A bit line contact 79 formed in an opening in an insulating layer 80 (of BPSG, for example) electrically connects source/drain region 73 to bit line 81. A shallow trench isolation structure formed in accordance with the present invention electrically isolates DRAM cell 50 from an adjacent DRAM cell and passing word line 92. Passing word line 92 has a $WSi_x$/ polycrystalline silicon structure. A dielectric layer 87 is formed on bit line 81 and aluminum wirings 89 are formed on dielectric layer 87. One of the aluminum wirings 89 is connected to bit line 81 by a contact stud 91 of tungsten, for example. A diffusion region 83 electrically connects third polycrystalline silicon fill 69 and drain/source region 74 of MOS transfer gate 60. This diffusion region is formed by outdiffusing dopants from the highly doped polycrystalline silicon fill in the storage trench into P-well 75. Diffusion region 83 and third polycrystalline silicon fill 69 constitute a buried strap for connecting trench capacitor 55 to transfer gate 60.

Figure 9A:
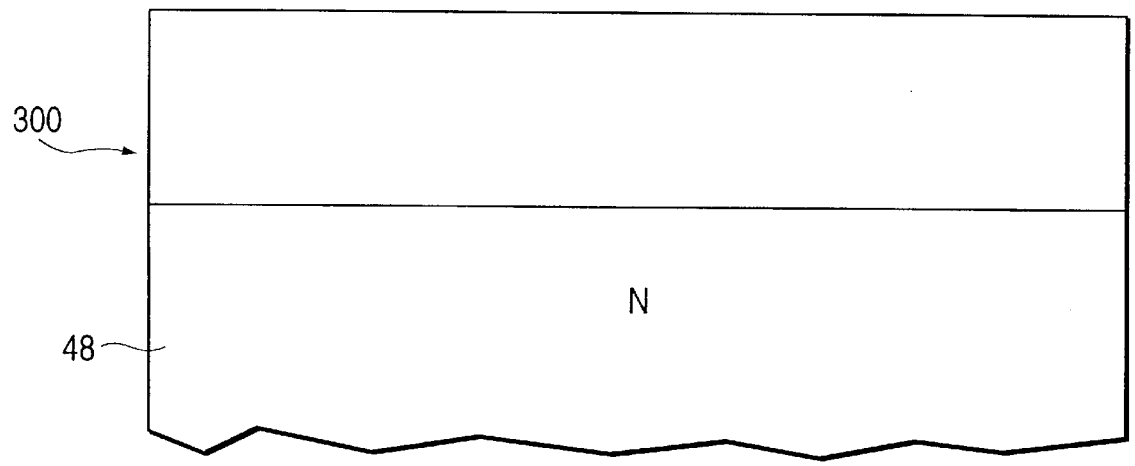
Figure 9B:
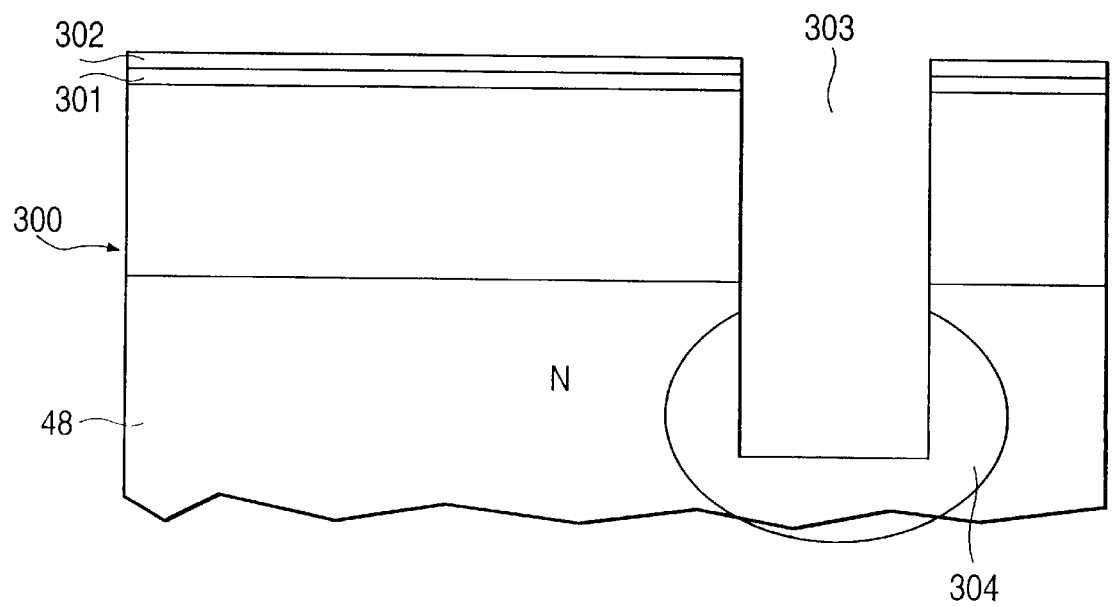
Figure 9C:
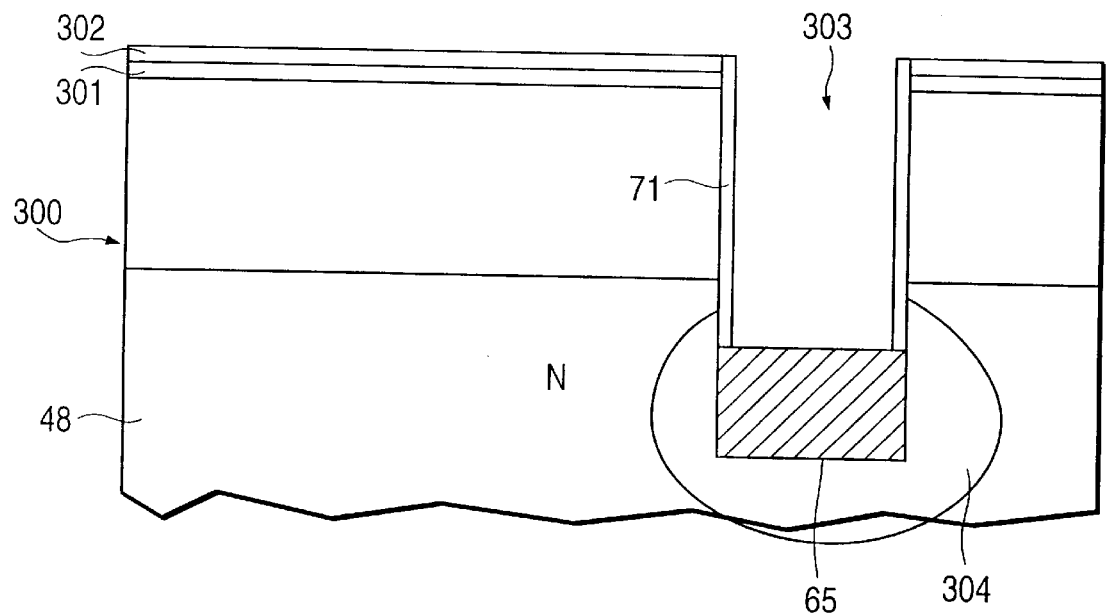

A method of manufacturing the DRAM cell 50 using the shallow isolation structure and method of the present invention will be described below with reference to FIGS. 9(a)–9(g). As shown in FIG. 9(a), a buried N-type well 48 is formed in a P-type semiconductor substrate 300 by implanting phosphorous below the intended P-well for a memory cell array. A buried N-type well may also be formed by other methods, e.g., P-well implantation into an N-type semiconductor substrate or by epitaxy, and the invention is not limited in this respect. A silicon nitride layer 302 having a thickness of about 0.2 micrometers is formed by chemical vapor deposition, for example, on the surface of a thin oxide layer 301 having a thickness of about 10 nanometers which is thermally grown on semiconductor substrate 300. Oxide layer 301 and silicon nitride layer 302 are patterned and etched to provide a mask for etching a trench 303. Trench 303 is etched using an anisotropic etching process to a depth of about 8 micrometers as shown in FIG. 9(b). After storage node trench 303 is etched, an N-type capacitor plate 304 is formed by outdiffusing arsenic from the lower portion of trench 303. This may be accomplished, for example, by depositing an arsenic doped glass layer, etching the arsenic doped glass layer to remain only at the lower portion of trench 303, and performing an annealing process to outdiffuse the arsenic. A storage node dielectric layer (not shown) such as an oxide-nitride (ON) layer or a nitride-oxide (NO) layer is then formed in trench 303. After the dielectric layer is formed, a first conductive region is formed by filling trench 303 with an impurity-doped first conductive material such as $N^+$-type polycrystalline silicon. The filling step may be carried out using chemical vapor deposition of silane or disilane, for example. The $N^+$-type polycrystalline silicon is then etched back to a first level within trench 303 using an isotropic etch process to form first trench fill 65. The level of first trench fill 65 is, for example, about 1.0 micrometer below the surface of semiconductor substrate 300. Collar oxide 71 is then formed on the sidewall of the portion of trench 303 opened by the etching back of the $N^+$-type polycrystalline silicon using low pressure chemical vapor deposition (LPCVD) or plasma-enhanced chemical vapor deposition (PECVD) TEOS as shown in FIG. 9(c).

Figure 9D:
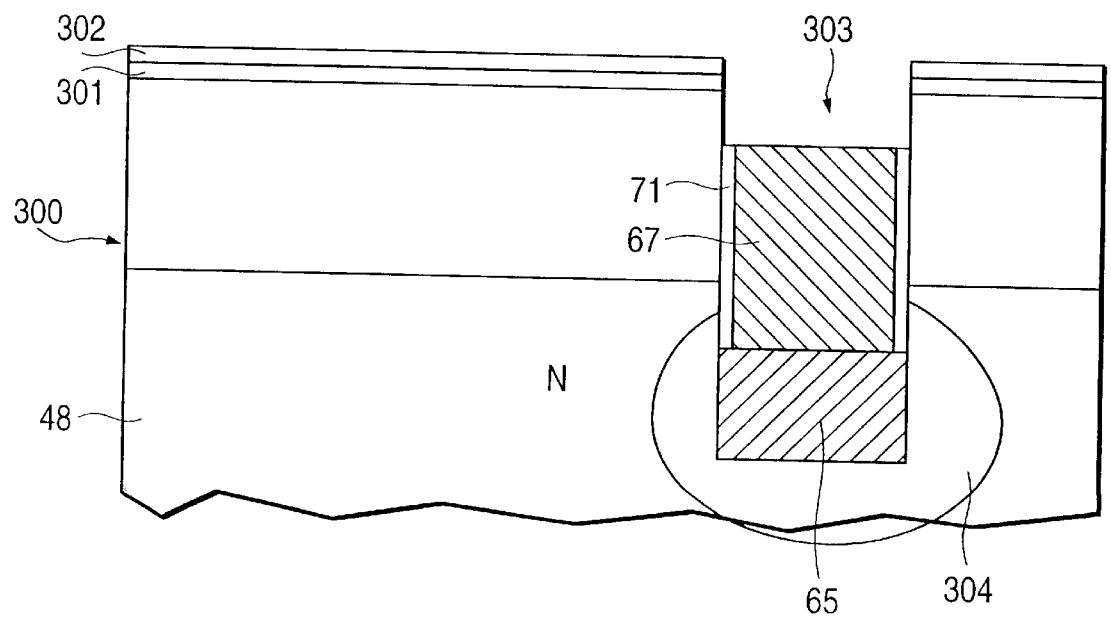

A second conductive region is formed by filling in the remainder of trench 303 with a second conductive material. The second conductive material may be, for example, $N^+$-type polycrystalline silicon or undoped polycrystalline silicon and may be formed by chemical vapor deposition (CVD). The second conductive material and the oxide collar 71 are then etched back to a second level within trench 303 to form second trench fill 67 which is insulated from the semiconductor substrate by collar oxide 71 as shown in FIG. 9(d). The depth of the buried strap to be formed in a subsequent process step is defined by this controlled etchback of the second conductive material and collar oxide 71. Second trench fill 67 is etched back to about 0.1 micrometer below the surface of semiconductor substrate 300. An in-situ removal of a native oxide in trench 303 is then performed. In particular, the native oxide on the upper surface of second trench fill 67 and on the sidewall of trench 303 through which impurities for the buried strap will subsequently be outdiffused are removed. This removal of native oxide may be carried out by an in-situ prebake in a hydrogen ambient at a temperature greater than 850° C., for example.

Figure 9E:
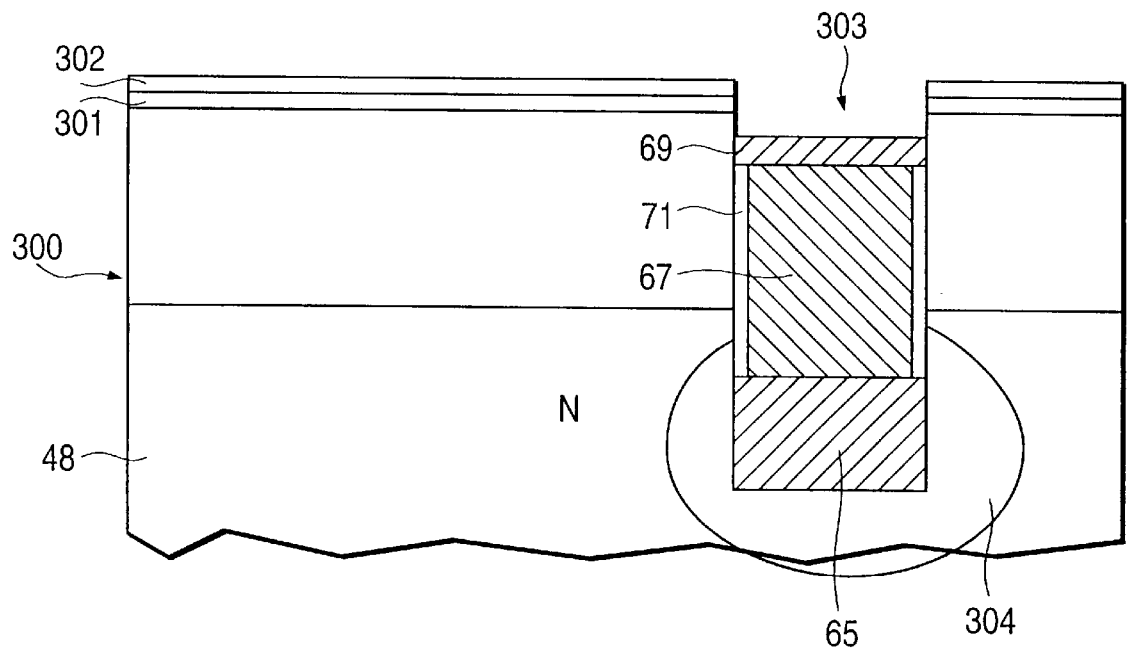

The portion of trench 303 opened by the etching back of collar oxide 71 and the second conductive material is then filled by a third conductive material. The third conductive material may be, for example, undoped polycrystalline silicon deposited by chemical vapor deposition (CVD). The polycrystalline silicon is then etched back using reactive ion etching, for example, to form a third trench fill 69 as shown in FIG. 9(e). The polycrystalline silicon is preferably etched back to about 0.05 micrometer below the surface of semiconductor substrate 300 as determined by the tolerable resistance of the buried strap, and by the recess etch controllability.

Figure 9F:
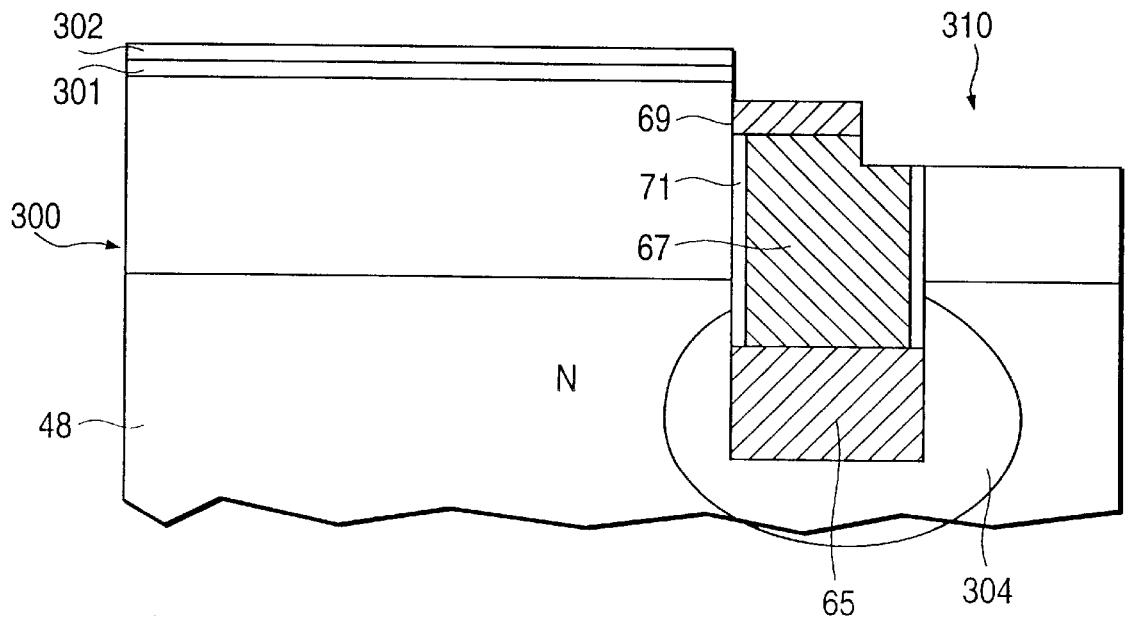

With reference to FIG. 9(f), a shallow trench 310 is formed to provide for shallow trench isolation. As described above, shallow trench isolation is used to isolate discrete memory cell devices to prevent interference therebetween. In particular, a shallow trench is formed as described above with respect to FIGS. 5(a)–5(i) or FIGS. 7(a)–7(h). Thus, for example, the trench 310 may be etched using a patterned photoresist formed on the pad silicon nitride layer 302 as a mask. The pad silicon nitride layer 302 is then isotropically etched to remove about 300 Å. The trench sidewall is then oxidized to form an oxide layer 320 having a thickness of about 100 Å and a silicon nitride layer 322 having a thickness of about 50 Å is then deposited. The oxide and nitride linings serve to isolate collar oxide 71 from oxidant, and thereby suppress dislocation and stress. The trench is then filled with an insulator 324 such as silicon dioxide and the trench fill is then planarized using chemical mechanical polishing (CMP) and/or reactive ion etching (RIE). The pad silicon nitride layer is then stripped by chemical dry etching (CDE) or hot phosphoric acid and the pad oxide is then removed using a wet etch for removing, for example, 200 Å of silicon dioxide. At this time, the silicon dioxide in the trench is also etched. A sacrificial silicon dioxide layer having a thickness of about 100 Å is then formed on the surface of the substrate 300 and impurities may implanted in what will become the channel regions of the transfer gates in order to control the threshold voltages thereof. The sacrificial oxide is then removed by etching away 120 Å of silicon dioxide.

A gate insulator may then be formed on the planar surface, and gate material may be deposited and patterned to form gate electrodes. Using the gate electrodes as masks, source/drain regions may be formed by ion implantation. Accordingly, transfer gates coupled to trench capacitors are realized. Interconnection between devices and metallization to the output terminals are conducted using techniques known in the art. During the complete DRAM fabrication process, impurities from the conductive regions within the trench are outdiffused to form strap portion 83.

In accordance with the above process, the corner portions of the shallow trench isolation structure are protected from etching during the memory cell fabrication process such that these corner portions are substantially level with the surface portion of said semiconductor substrate and the upper surface portion of the insulator 324 filling the shallow trench as shown in FIG. 9(g).

While a particular example has been described in which the shallow trench isolation structure and method of the present invention are incorporated into a memory device including a trench capacitor, the invention is not limited in this respect and may be applied to isolating elements of any semiconductor device formed on a substrate.

While the invention has been described in detail with reference to the appended drawings, the invention is limited in scope only by the claims. Moreover, any patent or publication cited herein should be construed to be incorporated by reference as to any subject matter deemed essential to the present disclosure.

I claim:

1. A method of forming a shallow trench isolation structure, comprising the steps of:

forming a pad oxide layer on a semiconductor substrate;

forming a pad nitride layer on said pad oxide layer;

forming an opening which extends through said pad nitride layer, said pad oxide layer, and into said semiconductor substrate;

isotropically etching said pad nitride layer, thereby pulling back said pad nitride layer from the portion of said opening extending through said pad oxide layer;

oxidizing portions of said semiconductor substrate exposed by said opening;

depositing an insulating layer to fill in said opening including the portion of said opening formed by the pulling back of said pad nitride layer;

planarizing the deposited insulating layer using said pulled-back pad nitride layer as a stopper layer; and removing said pulled-back pad nitride layer and said pad oxide layer.

2. The method according to claim 1, wherein said pad nitride layer is isotropically etched using one of the group consisting of HF/glycerol and hot phosphoric acid.

3. The method according to claim 1, wherein said insulating layer is planarized using at least one of the group consisting of chemical mechanical polishing and reactive ion etching.

4. The method according to claim 1, wherein the insulating layer comprises silicon dioxide.

5. The method according to claim 1, comprising the further step of:

forming a nitride layer on the oxidized portions of said semiconductor substrate prior to depositing said insulating layer.

6. The method according to claim 1, wherein said nitride layer comprises a silicon nitride layer.

7. A method of forming a shallow trench isolation structure, comprising the steps of:

forming a pad oxide layer on a semiconductor substrate;

forming a pad nitride layer on said pad oxide layer;

forming an opening which extends through said pad nitride layer, said pad oxide layer, and into said semiconductor substrate;

oxidizing portions of said semiconductor substrate exposed by said opening;

isotropically etching said pad nitride layer, thereby pulling back said pad nitride layer from the portion of said opening extending through said pad oxide layer;

depositing an insulating layer to fill in said opening including the portion of said opening formed by the pulling back of said pad nitride layer; and planarizing the deposited insulating layer using said pulled-back pad nitride layer as a stopper layer; and removing said pulled-back pad nitride layer and said pad oxide layer.

8. The method according to claim 7, wherein said pad nitride layer is isotropically etched using chemical dry etching.

9. The method according to claim 7, wherein said insulating layer is planarized using at least one of the group consisting of chemical mechanical polishing and reactive ion etching.

10. The method according to claim 7, wherein said insulating layer comprises silicon dioxide.

11. The method according to claim 7, comprising the further step of:

forming a nitride layer on the oxidized portions of said semiconductor substrate prior to depositing said insulating layer.

12. The method according to claim 7, wherein said nitride layer comprises a silicon nitride layer.

* * * * *

UNITED STATES PATENT AND TRADEMARK OFFICE
CERTIFICATE OF CORRECTION

PATENT NO.: 5,960,297

DATED: September 28, 1999

INVENTORS: Kazuo SAKI

It is certified that errors appear in the above-identified patent and that said Letters Patent is hereby corrected as shown below:

On the cover page, in the [54] Title, before "SHALLOW", insert --METHOD OF FORMING--; and replace "AND METHOD OF FORMING THE SAME" with --BY ISOTROPICALLY ETCHING A PAD NITRIDE LAYER WITH EXPOSED TOP STRUCTURE--.

In Claim 1, Column 9, Line 25, after "layer", insert --with a top surface of said pad nitride layer exposed--.

Line 29, after "opening", insert --after said step of isotropically etching--.

In Claim 7, Column 10, Line 17, after "layer", insert --with a top surface of said pad nitride layer exposed after said step of oxidizing--.

Signed and Sealed this

Twenty-second Day of August, 2000

Attest:

Q. TODD DICKINSON

*Attesting Officer*  *Director of Patents and Trademarks*